United States Patent
Ogawa et al.

(10) Patent No.: US 11,837,465 B2
(45) Date of Patent: Dec. 5, 2023

(54) DEPOSITION METHOD

(71) Applicant: Tokyo Electron Limited, Tokyo (JP)

(72) Inventors: Jun Ogawa, Yamanashi (JP); Takayuki Karakawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 140 days.

(21) Appl. No.: 17/468,875

(22) Filed: Sep. 8, 2021

(65) Prior Publication Data

US 2022/0084811 A1 Mar. 17, 2022

(30) Foreign Application Priority Data

Sep. 16, 2020 (JP) .................................. 2020-155660

(51) Int. Cl.
| | |
|---|---|
| *C23C 16/34* | (2006.01) |
| *H01L 21/02* | (2006.01) |
| *H01J 37/32* | (2006.01) |
| *C23C 16/458* | (2006.01) |
| *C23C 16/455* | (2006.01) |
| *C23C 16/511* | (2006.01) |

(52) U.S. Cl.
CPC ........ *H01L 21/0217* (2013.01); *C23C 16/345* (2013.01); *C23C 16/4584* (2013.01); *C23C 16/45538* (2013.01); *C23C 16/45553* (2013.01); *C23C 16/511* (2013.01); *H01J 37/3244* (2013.01); *H01L 21/0228* (2013.01); *H01L 21/02274* (2013.01); *H01J 37/32724* (2013.01); *H01J 2237/20214* (2013.01); *H01J 2237/332* (2013.01)

(58) Field of Classification Search
None
See application file for complete search history.

(56) References Cited

U.S. PATENT DOCUMENTS

| | | | | |
|---|---|---|---|---|
| 2015/0279681 A1* | 10/2015 | Knoops | ............... | H01L 21/0228 427/8 |
| 2017/0218510 A1* | 8/2017 | Kato | ................. | C23C 16/45551 |

FOREIGN PATENT DOCUMENTS

JP 2017-139306 8/2017

* cited by examiner

*Primary Examiner* — Shamim Ahmed
*Assistant Examiner* — Bradford M Gates
(74) *Attorney, Agent, or Firm* — IPUSA, PLLC

(57) ABSTRACT

A deposition method for embedding a SiN film in a recessed pattern formed on a surface of a substrate includes: (a) activating and supplying a first process gas containing $NH_3$ to the surface of the substrate and causing $NH_x$ groups to adsorb on the surface of the substrate, where x is 1 or 2; (b) supplying a silicon-containing gas to the surface of the substrate on which the $NH_x$ groups are adsorbed and causing the silicon-containing gas to adsorb on the $NH_x$ groups; and (c) activating and supplying a second process gas containing $N_2$ to the surface of the substrate on which the $NH_x$ groups are adsorbed and partly replacing the $NH_x$ groups with N groups, wherein (a) and (b) are repeated, and (c) is performed every time (a) and (b) are repeated a predetermined number of times.

7 Claims, 7 Drawing Sheets

DEPOSITION METHOD

CROSS-REFERENCE TO RELATED APPLICATION

The present application is based upon and claims priority to Japanese Patent Application No. 2020-155660, filed on Sep. 16, 2020, the entire contents of which are incorporated herein by reference.

BACKGROUND

1. Field

The present disclosure relates to a deposition method.

2. Background Art

There is a known deposition method cyclically repeating the steps of causing $NH_2$ groups to adsorb on a surface of a substrate containing a recessed pattern, partly converting the $NH_2$ groups to N groups, and causing a silicon-containing gas to selectively adsorb on the $NH_2$ groups. (see, for example, Patent Document 1).

PRIOR ART DOCUMENT

Patent Document

[Patent Document 1] Japanese Laid-open Patent Publication No. 2017-139306

The present disclosure provides a technique that enables to control the embedding property at the time of embedding a film in a recessed pattern.

SUMMARY

According to one aspect of the present disclosure, a deposition method embeds a SiN film in a recessed pattern formed on a surface of a substrate, the deposition method including: (a) activating and supplying a first process gas containing $NH_3$ to the surface of the substrate and causing $NH_x$ groups to adsorb on the surface of the substrate, where x is 1 or 2; (b) supplying a silicon-containing gas to the surface of the substrate on which the $NH_3$ groups are adsorbed and causing the silicon-containing gas to adsorb on the $NH_x$ groups; and (c) activating and supplying a second process gas containing $N_2$ to the surface of the substrate on which the $NH_x$ groups are adsorbed and partly replacing the $NH_x$ groups with N groups, wherein (a) and (b) are repeated, and (c) is performed every time (a) and (b) are repeated a predetermined number of times.

According to the present disclosure, it is possible to control the embedding property at the time of embedding a film in a recessed pattern.

DESCRIPTION OF THE EMBODIMENTS

Figure 1:
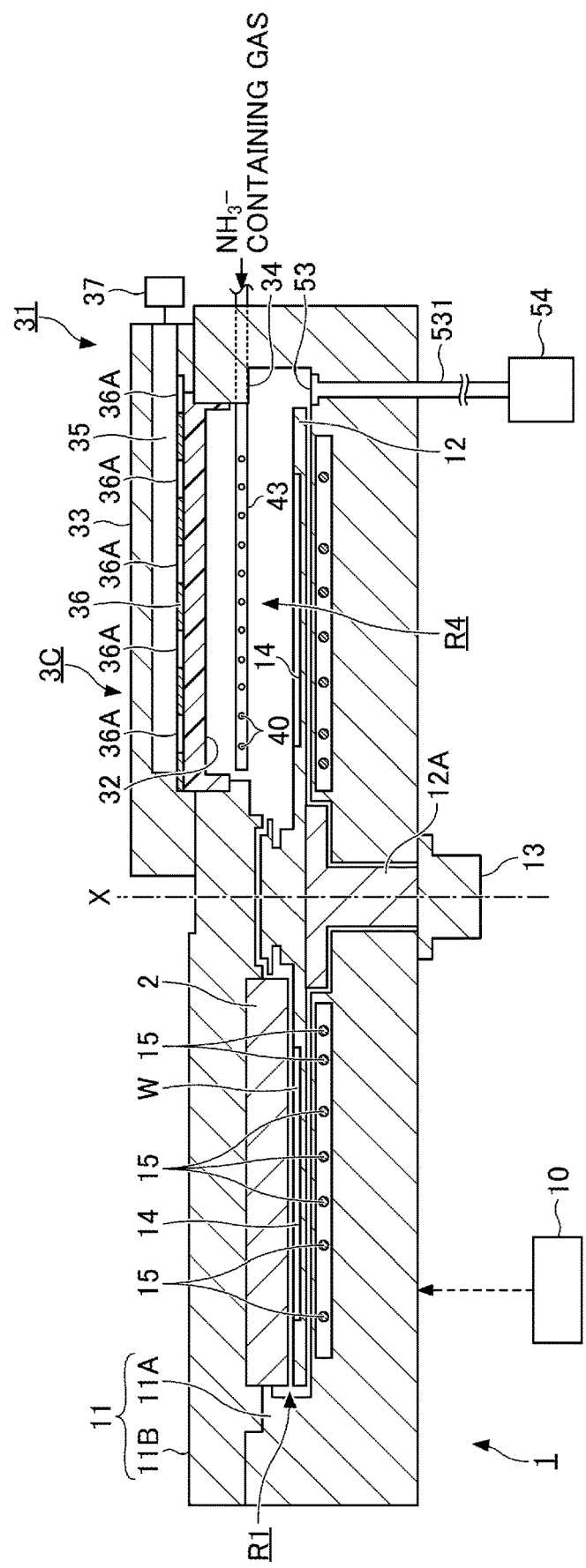
FIG. 1 a schematic longitudinal cross-sectional view illustrating an example of a deposition apparatus that conducts a deposition method according to an embodiment.

In the following, a non-limiting exemplary embodiment of the present disclosure will be described with reference to the drawings. In every drawing, the same or corresponding members or parts are designated by the same or corresponding reference numerals, and duplicate description is omitted as appropriate.

[Deposition Apparatus]

Figure 3:
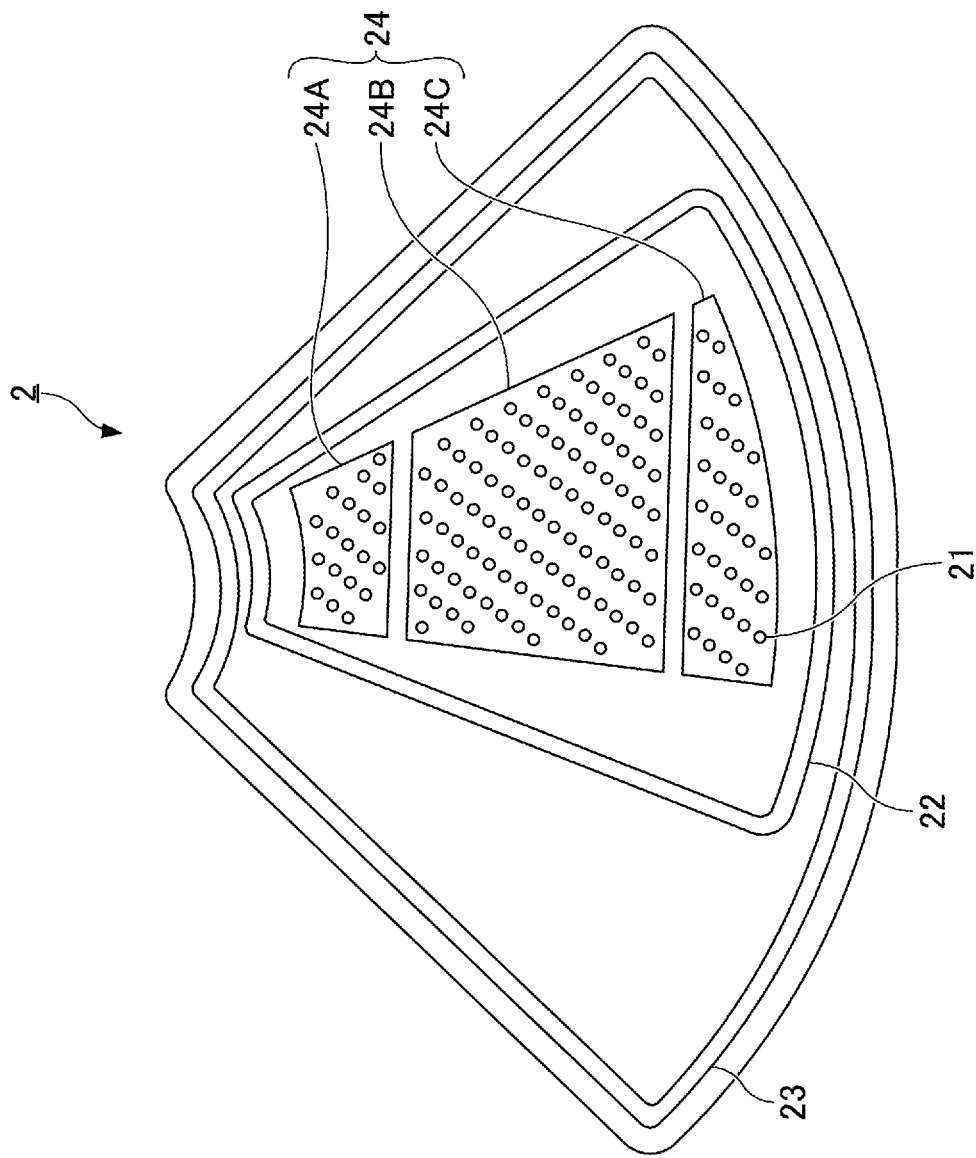
FIG. 3 is a bottom view of a gas supply and exhaust unit provided on the deposition apparatus of FIG. 1.

With reference to FIG. 1 and FIG. 3, an example of a deposition apparatus 1 for performing a deposition method according to an embodiment will be described. The deposition apparatus 1 is an apparatus that forms a silicon nitride (SiN) film on a surface of a substrate by an atomic layer deposition (ALD) process or a molecular layer deposition (MLD) process. The substrate may be, for example, a semiconductor wafer (hereinafter referred to as "wafer W"). A depression pattern such as trenches or vias may be formed on the surface of the wafer W, for example.

The deposition apparatus 1 includes a vacuum container 11 as a process container. The vacuum container 11 has a generally circular planar shape. The vacuum container 11 includes a container body 11A and a top plate 11B. The container body 11A constitutes a sidewall and a bottom. The top plate 11B is attached to the container body 11A via a sealing member, such as an O-ring, so as to seal the vacuum container 11 airtightly. The container body 11A and the top plate 11B can be made of, for example, aluminum (Al).

A rotation table 12 is provided within the vacuum container 11. The rotation table 12 has a circular shape. The rotation table 12 may be made, for example, of quartz. The rotation table 12 is provided horizontally with the center of the back surface supported by a support 12A. A rotation mechanism 13 is connected to the lower surface of the support 12A. The rotation mechanism 13 rotates the rotation table 12 around the axis X in the circumferential direction of the rotation table 12 in a clockwise direction in a plan view via the support 12A at the time of the deposition process.

Six circular recesses 14 are provided on the upper surface of the rotation table 12 along the circumferential direction (rotation direction) of the rotation table 12. The wafers W are placed on the 2C respective recesses 14. That is, each wafer W is mounted on the rotation table 12 so as to revolve by the rotation of the rotation table 12.

A plurality of heaters 15 are provided at the bottom of the vacuum container 11. The plurality of heaters 15 may be arranged, for example, concentrically. The plurality of heaters 15 heat the wafers W placed on the rotation table 12.

A transport port 16 is formed on the side wall of the vacuum container 11. The transport port 16 is an opening for delivering the wafers W. The transport port 16 is configured to be openable and closeable airtightly by a gate valve (not illustrated). A transport arm (not illustrated) is provided outside the vacuum container 11, and the wafers W are transported by the transport arm into the vacuum container 11.

On the rotation table 12, a gas supply and exhaust unit 2, a first reforming area R2, a second reforming area R3, and a reaction area R4 are provided toward the downstream side in the rotation direction of the rotation table 12 in this order along the rotation direction.

The gas supply and exhaust unit 2 includes a gas discharge port and an exhaust port for supplying silicon (Si)-containing gas. Hereinafter, the gas supply and exhaust unit 2 will be described also with reference to FIG. 3. The gas supply and exhaust unit 2 is formed in a fan shape that expands in the circumferential direction of the rotation table 12 from the central side toward the peripheral side of the rotation table 12 in a plan view. The lower surface of the gas supply and exhaust unit 2 is close to and faces the upper surface of the rotation table 12.

Gas discharge ports 21, an exhaust port 22, and a purge gas discharge port 23 are opened on the lower surface of the gas supply and exhaust unit 2. The gas discharge ports 21 are arranged in a plurality of lines in a fan-shaped area 24 inside the periphery of the lower surface of the gas supply and exhaust unit 2. At the time of the deposition process, the gas discharge ports 21 discharge the Si-containing gas like a shower downward during rotation of the rotation table 12 and supplies the gas to the entire surface of the wafer W. The silicon-containing gas may be, for example, a DCS [dichlorosilane] gas.

In the fan-shaped area 24, three areas 24A, 24B, and 24C are set from the central side of the rotation table 12 toward the peripheral side of the rotation table 12. The gas supply and exhaust unit 2 is provided with gas flow paths (not illustrated) partitioned from each other so that the Si-containing gas can be independently supplied to each of the gas discharge ports 21 provided in the respective areas 24A, 24B, and 240. The respective upstream sides of the gas flow paths partitioned from each other are each connected to a Si-containing gas supply source (not illustrated) via a pipe equipped with a gas supply device including a valve and a mass flow controller.

The exhaust port 22 and the purge gas discharge port 23 are circumferentially opened on the periphery of the lower surface of the gas supply and exhaust unit 2 so as to surround the fan-shaped area 24 and face the upper surface of the rotation table 12. The purge gas discharge port 23 is located outside the exhaust port 22. The area inside the exhaust port 22 on the rotation table 12 constitutes an adsorption area R1 where the Si-containing gas is adsorbed on the surface of the wafer W. An exhaust device (not illustrated) is connected to the exhaust port 22, and a supply source of purge gas is connected to the purge gas discharge port 23. The purge gas may be, for example, argon (Ar) gas.

At the time of the deposition process, discharge of the Si-containing gas from the gas discharge port 21, exhaust from the exhaust port 22, and discharge of the purge gas from the purge gas discharge port 23 are performed. Thereby, the Si-containing gas and the purge gas discharged toward the rotation table 12 are directed toward the exhaust port 22 through the upper surface of the rotation table 12 and are exhausted from the exhaust port 22. In this way, by discharging and exhausting the purge gas, the atmosphere of the adsorption area R1 can be separated from the outside atmosphere, and the Si-containing gas can be limitedly supplied to the adsorption area R1. That is, it is possible to suppress the mixing of the Si-containing gas supplied to the adsorption area R1 with respective gasses supplied by plasma forming units 3A to 3C, which will be described later below, to the exterior of the adsorption area R1 and active species of the gases. Therefore, as will be described later, a film deposition process using an ALD process or a MLD process can be applied to wafers W. Also, in addition to having a function to separate the atmosphere, the purge gas also has a function to remove the Si-containing gas that is excessively adsorbed on wafers W from the wafers W.

The first and second reforming areas R2 and R3 and the reaction area R4 are provided with plasma forming units 3A to 3C for activating gases supplied to the respective areas. Each of the plasma forming units 3A to 3C is similarly configured. In the following, the plasma forming unit 3C illustrated in FIG. 1 will be described as a representative.

The plasma forming unit 3C supplies gas for plasma formation onto the rotation table 12 and supplies a microwave to the gas for plasma formation to generate plasma on the rotation table 12. The plasma forming unit 3C includes an antenna 31 for supplying the microwave.

The antenna 31 includes a dielectric plate 32 and a metal waveguide 33. The dielectric plate 32 is formed in a substantially fan shape that expands from the central side to the peripheral side of the rotation table 12 in a plan view. The top plate 11B of the vacuum container 11 is provided with a through hole having a generally fan shape corresponding to the shape of the dielectric plate 32, and the inner peripheral surface at the lower end of the through hole extends slightly toward the center of the through hole to form a support 34. The dielectric plate 32 is provided to close the through hole from the upper side and face the rotation table 12, and the periphery of the dielectric plate 32 is supported by the support 34. The waveguide 33 is provided on the dielectric plate 32. The waveguide 33 includes an interior space 35 extending over the top plate 11B. A slot plate 36 is provided on the upper surface of the 1C dielectric plate 32 to be in contact with the dielectric plate 32. The slot plate 36 constitutes the lower section of the waveguide 33. The slot plate 36 has a plurality of slot holes 36A. The end toward the center of the rotation table 12 of the waveguide 33 is closed and a microwave generator 37 is connected to the end toward the periphery of the rotation table 12. For example, the microwave generator 37 supplies a microwave of 2.45 GHz to the waveguide 33.

A first gas injector 41 is provided at the 2C downstream side end of the first reforming area R2. The first gas injector 41 discharges a hydrogen ($H_2$)— containing gas toward the upstream side. By supplying $H_2$, H is bonded to unbonded hands in the SiN film and the film can be reformed into a dense film. Also, the first gas injector 41 discharges a nitrogen ($N_2$)-containing gas toward the upstream side. By supplying $N_2$, the adsorbed $NH_x$ (where x is 1 or 2) groups adsorbed on the surface are partly replaced by N groups, and the adsorption site by the $NH_x$ groups is partly eliminated. This enables selective adsorption of the Si-containing gas to be supplied next. Specifically, the $N_2$ gas activated by plasma does not reach the deep section (bottom) of the recessed pattern, and H is removed from the $NH_x$ groups adsorbed on the surface of the wafer W and the upper section of the recessed pattern, and is replaced with N groups.

A second gas injector 42 is provided at the upstream side end of the second reforming area R3. The second gas injector 42 discharges a $H_2$-containing gas toward the downstream side. By supplying $H_2$, H is bonded to unbonded hands in the SiN film and the film can be reformed into a dense film. Also, the second gas injector 42 discharges a $N_2$-containing gas toward the upstream side. By supplying $N_2$, the adsorbed $NH_x$ (where x is 1 or 2) groups adsorbed on the surface are partly replaced by N groups, and the adsorption site by the $NH_x$ groups is partly eliminated. This enables selective adsorption of the Si-containing gas to be supplied next. Specifically, the $N_2$ gas activated by plasma does not reach the deep section (bottom) of the recessed pattern, and H is removed from the $NH_x$ groups adsorbed on the surface of the wafer W and the upper section of the recessed pattern, and is replaced with N groups.

A third gas injector 43 is provided at the downstream side end of the reaction area R4. The third gas injector 43 discharges an ammonia ($NH_3$)-containing gas toward the upstream side. By supplying $NH_3$, $NH_x$ groups can be adsorbed on the surface of wafer W having the recessed pattern, and an adsorption site of the Si-containing gas can be formed. Also, the third gas injector 43 discharges a purge gas (e.g., Ar gas) toward the upstream side. The purge gas may be discharged, for example, when the $NH_3$-containing gas is not discharged from the third gas injector 43.

Figure 2:
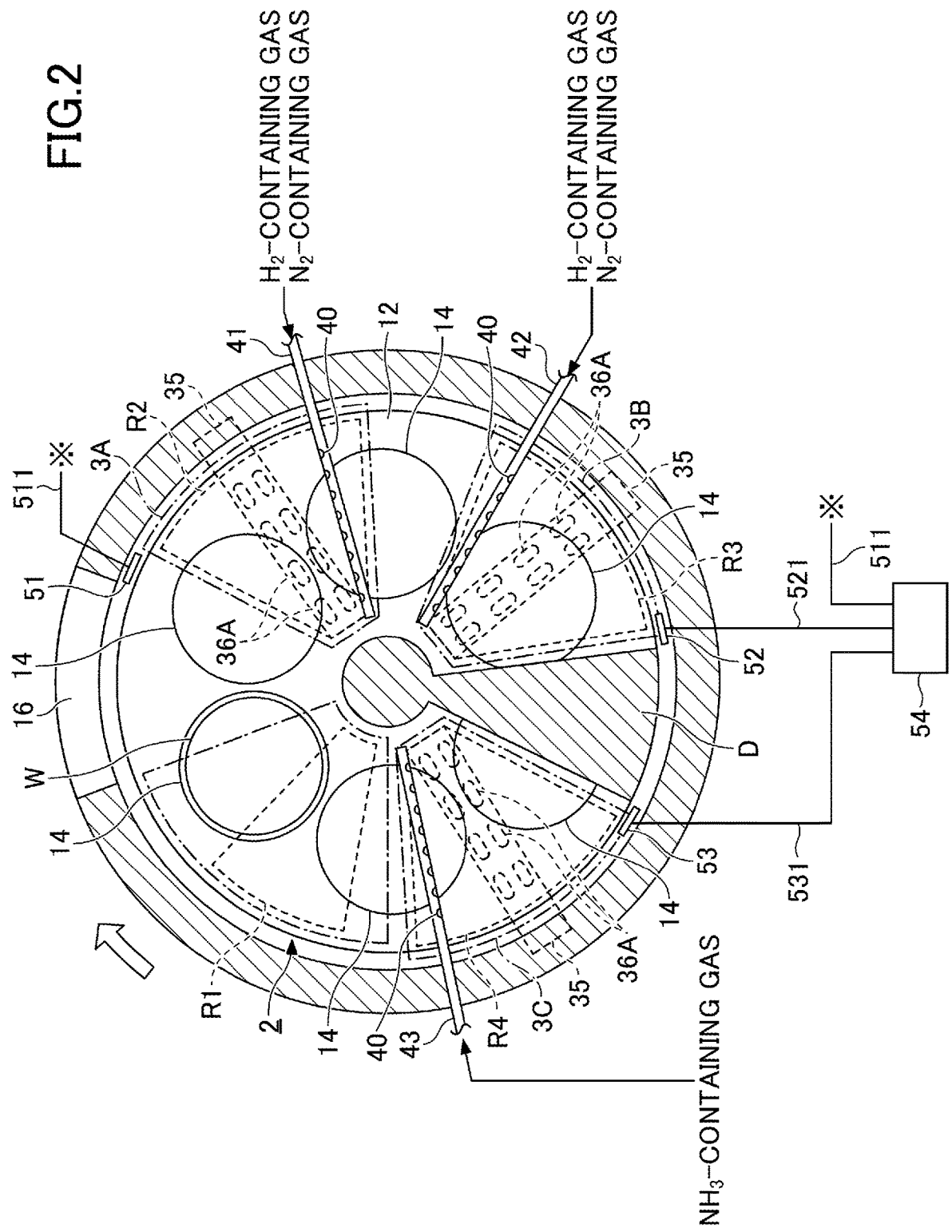
FIG. 2 is a schematic plan view of the deposition apparatus of FIG. 1.

The first to third gas injectors 41 to 43 are composed of an elongated tubular body with the tip side closed, for example, as illustrated in FIGS. 1 and 2. The respective first to third gas injectors 41 to 43 are provided on the respective sidewalls of the vacuum container 11 so as to extend horizontally from the sidewalls of the vacuum container 11 toward the central area, and are arranged to intersect the areas through which wafers W pass on the rotation table 12. Each of the first to third gas injectors 41 to 43 is formed with gas discharge ports 40 along the length direction thereof. For example, the gas discharge ports 40 are formed on the first to third gas injectors 41 to 43 in the areas covering the areas where the wafers W pass on the rotation table 12.

It should be noted that the first gas injector 41 is provided below the plasma forming unit 3A in the example of FIG. 2, but may be provided below an area adjacent to the downstream side in the rotation direction of the plasma forming unit 3A, for example. The second gas injector 42 is provided below the plasma forming unit 3B, but may be provided below an area adjacent to the upstream side in the rotation direction of the plasma forming unit 3B, for example. The third gas injector 43 is provided below the plasma forming unit 3C, but may be provided below an area adjacent to the downstream side in the rotation direction of the plasma forming unit 3C, for example.

In the first and second reforming areas R2 and R3, a microwave supplied to the waveguide 33 passes through the slot holes 36A in the slot plate 36 to the dielectric plate 32 and is supplied to the $H_2$ containing gas or the $O_2$ containing gas discharged below the dielectric plate 32. Thereby, plasma is formed limitedly in the first and second reforming areas R2 and R3 below the dielectric plate 32. In the reaction area R4, a microwave supplied to the waveguide 33 passes through the slot holes 36A in the slot plate 36 to the dielectric plate 32 and is supplied to the $NH_3$ containing gas discharged below the dielectric plate 32. Thereby, plasma of the $NH_2$ containing gas is formed limitedly in the reaction area R4 below the dielectric plate 32.

A separation area D is provided between the second reforming area R3 and the reaction area R4 as illustrated in FIG. 2. The ceiling surface of the separation area D is set to be lower than the respective ceiling surfaces of the second reforming area R3 and the reaction area R4. The separation area D is formed in a fan shape that expands in the circumferential direction of the rotation table 12 from the central side toward the peripheral side of the rotation table 12 in a plan view, and the lower surface thereof is close to and faces the upper surface of the rotation table 12. The distance between the lower surface of the separation area D and the upper surface of the rotation table 12 may be set to, for example, 3 mm to prevent gas from penetrating below the separation area D. It should be noted that the lower surface of the separation area D may be set to the same height as the lower surface of the top date 11B.

In addition, outside the rotation table 12, a first exhaust port 51, a second exhaust port 52, and a third exhaust port 53 are opened at respective positions corresponding to an upstream side end of the first reforming area R2, a downstream side end of the second reforming area R3, and an upstream side end of the reaction area R4, respectively. The first exhaust port 51 evacuates the $H_2$-containing gas and the $N_2$-containing gas discharged from the first gas injector 41. The second exhaust port 52 is provided in the vicinity of the upstream side of the separation area D in the rotation direction and exhausts the $H_2$-containing gas and the $N_2$-containing gas discharged from the second gas injector 42. The third exhaust port 53 is provided in the vicinity of the downstream side of the separation area D in the rotation direction, and exhausts the $NH_3$-containing gas discharged from the third gas injector 43.

As illustrated in FIG. 1, the third exhaust port 53 is formed to be opened upwardly at the outside area of the rotation table 12 in the container body 11A of the vacuum container 11. The opening of the third exhaust port 53 is positioned below the rotation table 12. The third exhaust port 53 is connected to an exhaust device 54 via an exhaust flow path 531. The first and second exhaust ports 51 and 52 are also configured similarly to the third exhaust port 53 and are connected, for example, to the common exhaust device 54 via exhaust flow paths 511 and 521. The respective exhaust flow paths 511, 521, and 531 are provided with respective exhaust volume adjustors (not illustrated) so that the exhaust volumes from the first to third exhaust ports 51 to 53 by the exhaust device 54 are individually adjustable, for example. It should be noted that the exhaust volumes from the first to third exhaust ports 51 to 53 may be adjusted by a common exhaust volume adjuster. In this manner, in the first and second reforming areas R2 and R3 and the reaction area R4, the respective gases discharged from the first to third gas injectors 41 to 43 are exhausted from the first to third exhaust ports 51 to 53, and a vacuum atmosphere with a pressure corresponding to these exhaust volumes is formed in the vacuum container 11.

As illustrated in FIG. 1, the deposition apparatus 1 is provided with a controller 10 made of a computer. A program is stored in the controller 10. For the program, a group of steps is installed so that a control signal is transmitted to each section of the deposition apparatus 1 to control the operation of each section, and the deposition method, which will be described later below, is executed. Specifically, the rotation speed of the rotation table 12 by the rotation mechanism 13, the flow rate and the supply/stop of gas by each gas supply device, the exhaust volume by the exhaust device 54, the supply/stop of the microwave to the antenna 31 from the microwave generator 37, the power supply to the heaters 15, and the like are controlled by the program. The control of the power supply to the heaters 15 is the control of the temperature of the wafers W, and the control of the exhaust volume by the exhaust device 54 is the control of the pressure in the vacuum container 11. The program is installed in the controller 10 from a storage medium such as a hard disk, a compact disk, a magneto-optical disk, or a memory card.

<Deposition Method>

Figure 4:
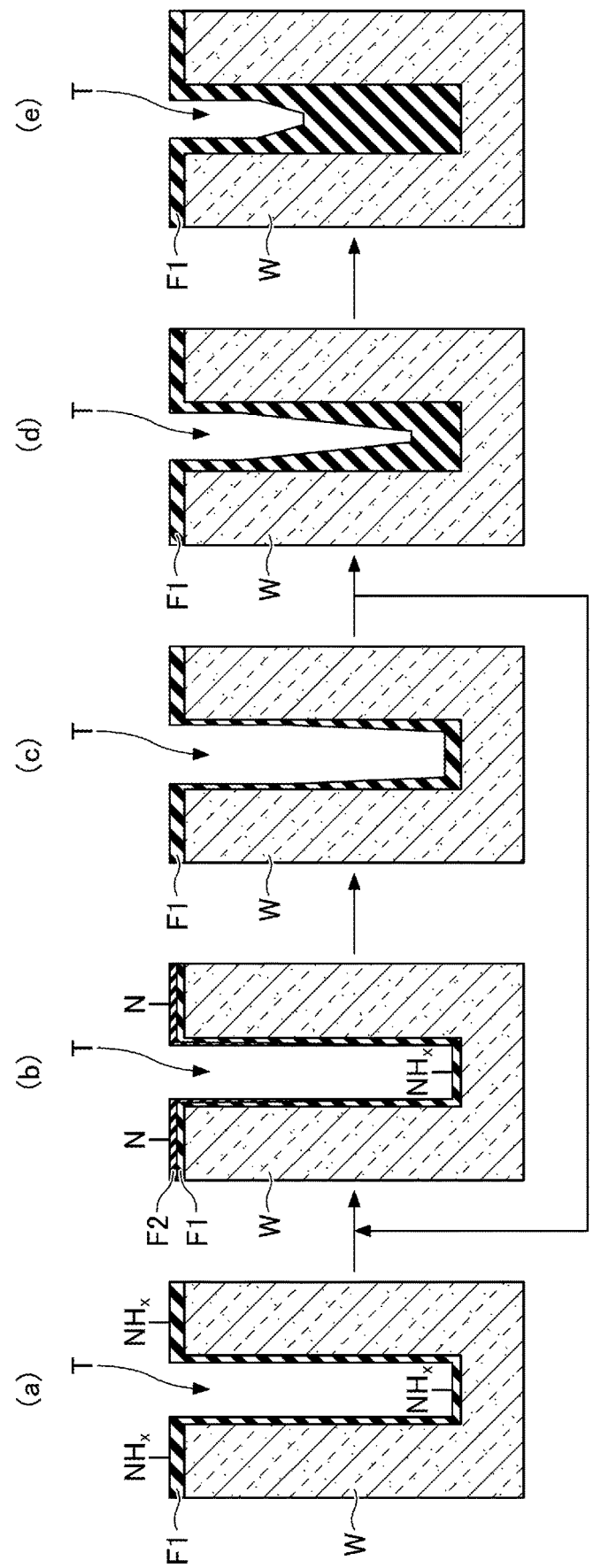
FIG. 4 is a diagram illustrating an example of a deposition method according to the embodiment.
Figure 5:
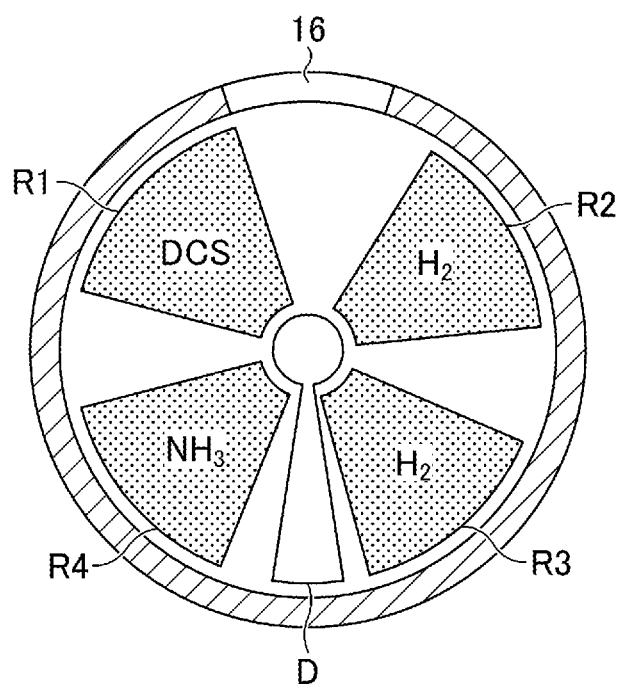
FIG. 5 is a diagram for describing a SiN deposition step in the deposition method of FIG. 4.
Figure 6:
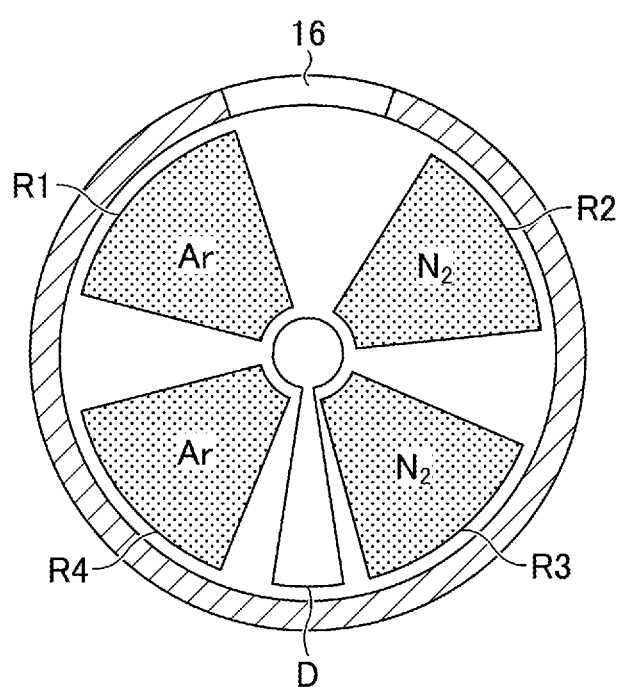
FIG. 6 is a diagram for describing a $N_2$ plasma step in the deposition method of FIG. 4.

Referring to FIG. 4 to FIG. 6, an example of a deposition method according to an embodiment will be described. The deposition method according to the embodiment can be performed by various deposition apparatuses that are a deposition apparatus capable of deposition by an ALD method or a MLD method. Hereinafter, an example carried out by using the deposition apparatus 1 will be described.

The deposition method of the embodiment may be a method that embeds a SiN film in a recessed pattern, such as a trench T or via formed on the surface of a wafer N by repeatedly performing a SiN deposition step and a $N_2$ plasma step, for example. Hereinafter, DOS gas is used as the Si-containing gas discharged from the gas discharge port 21, and Ar gas is used as the purge gas discharged from the purge gas discharge port 23. Also, $N_2$ gas is used as the $N_2$-containing gas discharged from the first and second gas injectors 41 and 42, and $NH_3$ gas is used as the $NH_3$-containing gas discharged from the third gas injector 43. However, the Si-containing gas, the purge gas, the $N_2$-containing gas, and the $NH_3$-containing gases are not limited the above gasses.

In the SiN deposition step, wafers W are first mounted on the respective recesses 14 of the rotation table 12 and the inside of the vacuum container 11 is made airtight. The wafers W mounted on the recesses 14 are heated to a predetermined temperature by the heaters 15. The temperature of each wafer W may be set to a temperature that enables the surface of the wafer W to be nitrided with the active species of $NH_3$ gas and may be set to, for example, between 250° C. or more and 600° C. or less. Subsequently, by exhausting from the first to third exhaust ports 51 to 53, the pressure in the vacuum container 11 is adjusted to a predetermined pressure. The pressure in the vacuum container 11 may be set to, for example, 2 Torr (267 Pa). Also, the rotation table 12 is rotated at a first rotation speed. The first rotation speed may be set to, for example, 20 rpm.

Subsequently, as illustrated in FIG. 5, the adsorption area R1 is supplied with the DCS gas, the first and second reforming areas R2 and R3 are supplied with active species of the $H_2$ gas, and the reaction area R4 is supplied with active species of the $NH_3$ gas.

More specifically, at the adsorption area R1, the DCS gas is discharged from the gas discharge port 21 of the gas supply and exhaust unit 2, and the Ar gas is discharged from the purge gas discharge port 23, and exhaust from the exhaust port 22 is performed. The flow rate of the DCS gas may be set to, for example, 800 sccm.

At the first reforming area R2, the $H_2$ gas is supplied from the first gas injector 41 and the microwave is supplied from the microwave generator 37. This activates the $H_2$ gas by plasma and forms the plasma of the $H_2$ gas in the first reforming area R2. At the first reforming area R2, the $H_2$ gas is discharged horizontally from the first gas injector 41, which is located at the downstream side end, toward the upstream side and flows toward the first exhaust port 51, which is located at the upstream side end. Thus, the $H_2$ gas flows across the entire first reforming area R2. The flow rate of the $H_2$ gas may be set to, for example, 3000 sccm. The microwave output may be set to, for example, 2500 W.

At the second reforming area R3, the $H_2$ gas is supplied from the second gas injector 42 and the microwave is supplied from the microwave generator 37. This activates the $H_2$ gas by plasma and forms the plasma of the $H_2$ gas in the second reforming area R3. At the second reforming area R3, the $H_2$ gas is discharged horizontally from the second gas injector 42, which is located at the upstream side end, toward the downstream side and flows toward the second exhaust port 52, which is located at the downstream side end. Thus, the $H_2$ gas flows across the entire second reforming area R3. The $H_2$ gas discharged to the second reforming area R3 partly flows into the separation area D, but since the ceiling of the separation area D is low and the conductance is small, the $H_2$ gas is pulled back by the suction force of the second exhaust port 52 and is exhausted into the second exhaust port 52. The flow rate of the $H_2$ gas may be set to, for example, 3000 sccm. The microwave output may be set to, for example, 2500 W.

At the reaction area R4, the $NH_3$ gas is supplied from the third gas injector 43 and the microwave is supplied from the microwave generator 37. This activates the $NH_3$ gas by plasma and forms the plasma of the $NH_3$ gas in the reaction area R4. At the reaction area R4, the $NH_3$ gas is discharged horizontally from the third gas injector 43, which is at the downstream side end, toward the upstream side, and flows toward the third exhaust port 53, which is at the upstream side end. Thus, the $NH_3$ gas flows across the entire reaction area R4. The $NH_3$ gas discharged to the reaction area R4 partly flows into the separation area D, but since the ceiling of the separation area D is low and the conductance is small, the $NH_3$ gas is pulled back by the suction force of the third exhaust port 53 and is exhausted into the third exhaust port 53. Accordingly, between the first and second reforming areas R2 and R3 and the reaction area R4, the flowing areas of the $NH_3$ and H2 gases are separated from each other and the mixing of the $NH_3$ gas and the $H_2$ gas is suppressed. The flow rate of the $NH_3$ gas may be set to, for example, 600 sccm. The microwave output may be set to, for example, 2500 W.

In such a state, when each wafer W passes through the reaction area R4 by rotation of the rotation table 12, an active species, such as N (nitrogen)-containing radicals derived from the $NH_3$ gas, is supplied to the surface of each wafer W. This nitrides the surface layer of each wafer W and forms a nitride film.

Subsequently, through the rotation of the rotation table 12, when each wafer N is located at the adsorption area R1, the DCS gas is supplied to and adsorbed on the surface of the nitride film. Subsequently, the rotation table 12 rotates, the wafer W moves to the outside of the adsorption area R1, the Ar gas is supplied to the surface of the wafer W, and the adsorbed excess DCS gas is removed.

Subsequently, when each wafer W reaches the reaction area R4 by rotation of the rotation table 12, the active species of the $NH_3$ gas contained in the plasma is supplied to the wafer W and reacts with the DCS gas to form a layer of SiN on the nitride film in an island shape. Also, when each wafer W reaches the first and second reforming areas R2 and R3 by rotation of the rotation table 12, H is bonded to unbonded hands in the SiN film by the active species of the $H_2$ gas contained in the plasma, and the film is reformed into a dense film. Since the DCS gas contains chlorine (Cl), when the DCS gas is used as the Si-containing gas, the chlorine component may be incorporated into the deposited SiN film as an impurity. Therefore, by emitting the plasma of the $H_2$ gas in the first and second reforming areas R2 and R3, the chlorine component contained in the thin film is desorbed by the action of the active species of the $H_2$ gas and the film is reformed into a more pure (dense) nitride film.

Thus, as illustrated in FIG. 5, each wafer N repeatedly moves to the adsorption area R1, the first reforming area R2, the second reforming area R3, and the reaction area R4 in sequence, and receives the supply of the DOS gas, the supply of the active species of the gas, and the supply of the active species of the $NH_3$ gas in sequence. This conformally forms a SiN film F1 on the surface of the wafer W having the trench T, as illustrated in FIG. 4(a).

Upon repeating the supply of the DCS gas, the supply of the active species of the $H_2$ gas, and the supply of the active species of the $NH_3$ gas a predetermined number of times, for example, discharge and exhaust of each gas by the gas supply and exhaust unit 2 are stopped. Also, the SiN deposition step is finished by respectively stopping the supply of the $H_2$ gas and power in the plasma forming units 3A and 3B and the supply of the $NH_2$ gas and power in the plasma forming unit 3C.

In the $N_2$ plasma step, in a state in which the wafers W are mounted on the recesses 14 of the rotation table 12, the rotation table 12 is rotated at a second rotation speed. The second rotation speed may be, for example, a rotation speed greater than the first rotation speed. The second rotation speed may be set to, for example, 1 rpm to 100 rpm. In the $N_2$ plasma step, for example, each wafer W is heated to the same temperature as in the SiN deposition step, and the pressure in the vacuum container 11 may be set to the same pressure as in the SiN deposition step. Accordingly, the $N_2$ plasma step can be continuously performed after the SiN film deposition step.

Subsequently, as illustrated in FIG. 6, the Ar gas is supplied to the adsorption area R1, the active species of the $N_2$ gas is supplied to the first and second reforming areas R2 and R3, and the Ar gas is supplied to the reaction area R4.

More specifically, in the adsorption area R1, the Ar gas is discharged from the purge gas discharge port 23 of the gas supply and exhaust unit 2 and exhaust from the exhaust port 22 is performed. It should be noted that the Ar gas may also be discharged from the gas discharge port 21 of the gas supply and exhaust unit 2.

At the first reforming area R2, the $N_2$ gas is supplied from the first gas injector 41 and the microwave is supplied from the microwave generator 37. This activates the $N_2$ gas by plasma and forms the plasma of the $N_2$ gas in the first reforming area R2. At the first reforming area R2, the $N_2$ gas is discharged horizontally from the first gas injector 41, which is at the downstream side end, toward the upstream side and flows toward the first exhaust port 51, which is at the upstream side end. Thus, the $N_2$ gas flows across the entire first reforming area R2. The flow rate of the $N_2$ gas may be set to, for example, 3000 sccm.

At the second reforming area R3, the $N_2$ gas is supplied from the second gas injector 42 and the microwave is supplied from the microwave generator 37. This activates the $N_2$ gas by plasma and forms the plasma of the $N_2$ gas in the second reforming area R3. At the second reforming area R3, the $N_2$ gas is discharged horizontally from the second gas injector 42, which is at the upstream side end, toward the downstream side and flows toward the second exhaust port 52, which is at the downstream side end. Thus, the $N_2$ gas flows across the entire second reforming area R3. The $N_2$ gas discharged to the second reforming area R3 partly flows into the separation area D, but since the ceiling of the separation area D is low and the conductance is small, the $N_2$ gas is pulled back by the suction force of the second exhaust port 52 and is exhausted into the second exhaust port 52. The flow rate of the $N_2$ gas may be set to, for example, 3000 sccm.

At the reaction area R4, the Ar gas is supplied from the third gas injector 43 and the microwave is supplied from the microwave generator 37. At the reaction area R4, the Ar gas is discharged horizontally from the third gas injector 43, which is at the downstream side end, toward the upstream side, and flows toward the third exhaust port 53, which is at the upstream side end. Thus, the Ar gas flows across the entire reaction area R4. The Ar gas discharged to the reaction area R4 partly flows into the separation area D, but since the ceiling of the separation area D is low and the conductance is small, the Ar gas is pulled back by the suction force of the third exhaust port 53 and is exhausted into the third exhaust port 53.

In such a state, when each wafer W passes through the first and second reforming areas R2 and R3 by rotation of the rotation table 12, the $NH_x$ groups on the upper surface and the upper section of the trench T are replaced with N groups by the $N_2$ gas activated by plasma. Since the activated $N_2$ gas has a relatively short lifetime, it does not reach the deep portion (bottom) of the trench T, and removes, only at the upper surface and the upper section of the trench T, H from the $NH_x$ groups to replace with the N groups. A $NH_x$ group function as an adsorbent group with respect to a raw material gas such as DOS, while a N group functions as a non-adsorbent group. Therefore, a non-adsorbent site is formed on the upper surface and the upper section of the trench T, and an adsorbent site is formed in the vicinity if the bottom of the trench T.

Thus, as illustrated in FIG. 6, each wafer N repeatedly moves to the adsorption area R1, the first reforming area R2, the second reforming area R3, and the reaction area R4 in sequence, and receives the supply of the Ar gas, the supply of the active species of the $N_2$ gas, and the supply of the Ar in sequence. Thereby, the $NH_x$ groups on the upper surface and the upper section of the trench T are replaced with N groups as illustrated in FIG. 4(b). In FIG. 4(b), the area nitrided by the N groups is indicated by F2. When a predetermined time has elapsed, for example, the discharge and the exhaust of the Ar gas by the gas supply and exhaust unit 2 are stopped. Also, the $N_2$ plasma step is finished by respectively stopping the supply of the $N_2$ gas and power in the plasma forming units 3A and 3B and the supply of the Ar gas in the plasma forming unit 3C.

Next, by carrying out the SiN deposition step, a SiN film is deposited thicker at the bottom than at the upper section of the trench T. Specifically, each wafer W repeatedly moves to the adsorption area R1, the first and reforming areas R2 and R3, and the reaction area R4 in sequence, and receives the supply of the DCS gas, the supply of the active species of the $H_2$ gas, and the supply of the active species of the $NH_3$ gas in sequence. In this case, the DOS is adsorbed on $NH_x$ groups but not on N groups. Therefore, the DCS adsorbs only near the bottom of the trench T. Accordingly, the DCS is embedded in the trench T in a bottom-up manner, as illustrated FIG. 4(c).

Hereinafter, by repeating the $N_2$ plasma step and the SiN deposition step, a SiN film F1 is embedded so as to bottom up from the bottom surface of the trench T, as illustrated in FIG. 4(d) and FIG. 4(e). Then, the SiN film F1 is embedded and deposited in the trench T, and at a stage when the trench T is completely filled, the deposition process is completed. This completes the deposition method of the embodiment.

After the deposition process is completed, the rotation table 12 is stopped. Subsequently, the gate valve is opened, and each wafer W to which the deposition treatment has been applied is carried out from the transport port 16 by a transport arm (not illustrated). Upon all the wafers W having been carried out, the entire deposition process is completed. If necessary, a wafer W to be processed next is carried in, and a deposition process is also performed similarly.

As described above, according to the deposition method of the embodiment, the $N_2$ plasma step is intermittently inserted with respect to the SiN deposition step. Thus, it is possible to easily adjust the time allocation between the SiN deposition step and the $N_2$ plasma step. As a result, the penetration area (depth) of the active species of the $N_2$ gas into the recessed pattern can be controlled, and thus the embedding property at the time of embedding the film in the recessed pattern can be controlled. Depending on the shape of the recessed pattern (e.g., the aspect ratio), the SiN film can be embedded in the recessed pattern with high productivity and good bottom-up property.

For example, for a recessed pattern with a low aspect ratio, the penetration area (depth) of the active species of the $N_2$ gas into the recessed pattern may be shallower than for a recessed pattern with a high aspect ratio. Therefore, by shortening the time of the $N_2$ plasma step with respect to the SiN deposition step, the penetration area (depth) of the active species of the $N_2$ gas into the recessed pattern is made shallow. Thereby, the time of the SiN deposition step occupying in the total of the SiN deposition step and the $N_2$ plasma step is increased. As a result, an embedding deposition with high bottom-up property can be performed while maintaining high productivity.

Also, for example, for a recessed pattern with a high aspect ratio, the penetration area (depth) of the active species of the $N_2$ gas into the recessed pattern is preferably deeper than for a recessed pattern with a low aspect ratio. Therefore, by lengthening the time of the $N_2$ plasma step with respect to the SiN deposition step, the penetration area (depth) of the active species of the $N_2$ gas into the recessed pattern is made deep. Thereby, the SiN film is embedded so as to bottom up from the bottom surface of the recessed pattern. As a result, the SiN film can be embedded with good bottom-up property, even for a recessed pattern with a high aspect ratio.

In this way, by intermittently inserting the $N_2$ plasma step with respect to the SiN deposition step, the embedding property can be controlled in accordance with a recessed pattern.

Examples

Figure 7:
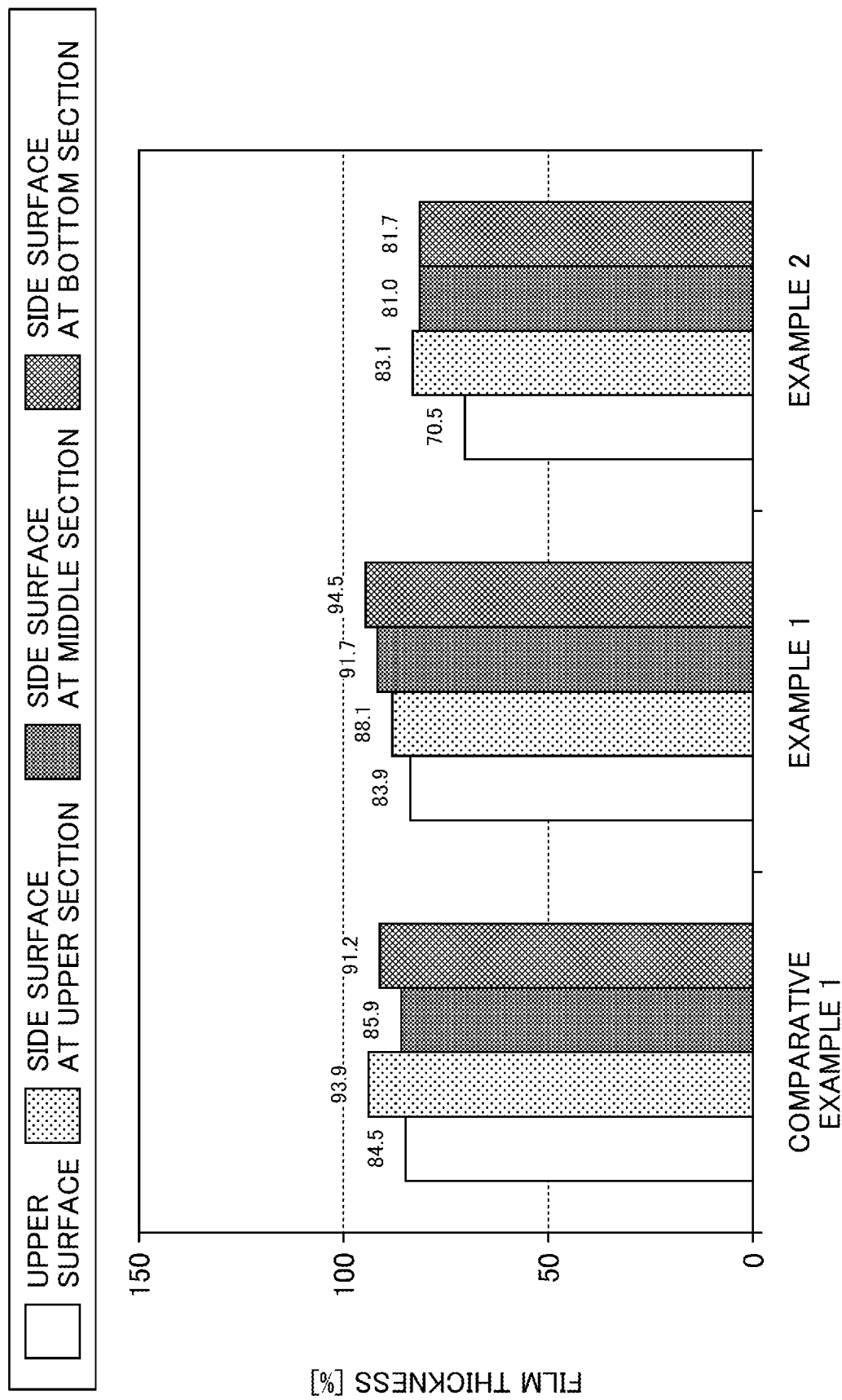
FIG. 7 is a diagram illustrating results of Examples carried out with the deposition method of the embodiment and Comparative Example.
Figure 8:
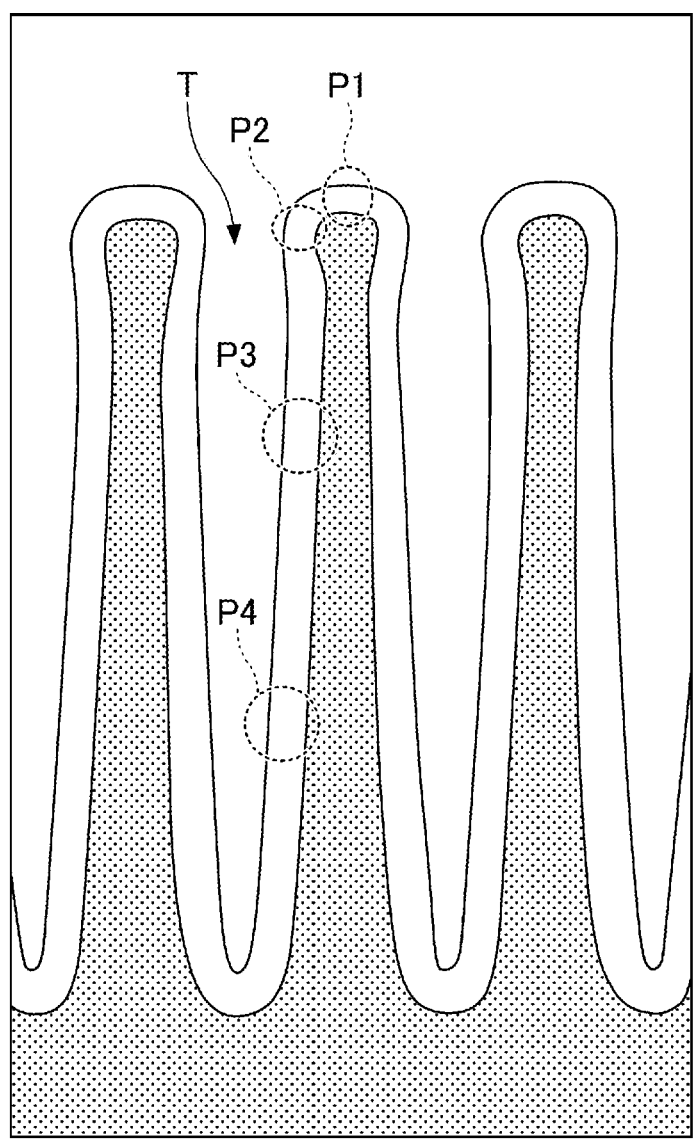
FIG. 8 is a diagram for describing the results of FIG. 7.

Referring to FIG. 7 and FIG. 8, Examples carried out by using the deposition apparatus 1 described above will be described.

In Example 1, a SiN film was deposited on a blanket wafer and a patterned wafer by repeating the SiN film deposition step and the $N_2$ plasma step, and the film thickness of the deposited SiN film was measured. A blanket wafer is a wafer that is not patterned on the surface. A patterned wafer is a wafer on which a pattern is formed on the surface and has a surface area greater than that of a blanket wafer.

In Example 1, in the SiN deposition process, a DCS gas was supplied to adsorption area R1 at a flow rate of 800 sccm, a $H_2$ gas was supplied to each of the first and second reforming areas R2 and R3 at a flow rate of 3000 sccm, and a $NH_3$ gas was supplied to reaction area R4 at a flow rate of 600 sccm. Microwaves were also supplied to the first and second reforming areas R2 and R3 and the reaction area R4 at an output of 2500 W. Further, a wafer N placed at a recess 14 was heated to 400° C. In addition, the rotation table 12 was rotated at a rotation speed of 20 rpm.

In Example 1, in the $N_2$ plasma step, an Ar gas was supplied to the adsorption area R1, a $N_2$ gas was supplied to each of the first and second reforming areas R2 and R3 at a flow rate of 300 sccm, and an Ar gas was supplied to the reaction area R4. Also, microwaves were supplied to the first and second reforming areas R2 and R3 at an output of 2500 W. Further, the wafer W placed at the recess 14 was heated to 400° C. In addition, the rotation table 12 was rotated at a rotation speed of 50 rpm.

Example 2 is an example carried out under conditions similar to those of Example 1 except that the rotation table 12 was rotated at a rotation speed of 100 rpm in the $N_2$ plasma step.

Comparative Example 1 is an example for which only the SiN film deposition step was performed without performing the $N_2$ plasma step. The conditions of the SiN deposition step are the same as those of Example 1.

The results of Examples 1 and 2 and Comparative Example 1 are illustrated in FIG. 7. In FIG. 7, the upper surface, the side surface at the upper section, the side surface at the middle section, and the side surface at the lower section indicate the results of the measurement of the film thickness of the SiN film at respective positions P1 to P4 in the trench T illustrated in FIG. 8. In FIG. 7, for each of Examples 1 and 2 and Comparative Example 1, the film thickness of the SiN film deposited on the blanket wafer was set to a reference state of 100%.

In Comparative Example 1, the film thickness of the upper surface was 84.5%, the film thickness of the side surface at the upper section was 93.9%, the film thickness of the side surface at the middle section was 85.9%, and the film thickness of the side surface at the lower section was 91.2%. The deposition was performed such that the film was thick at the side surface at the upper section and the side surface at the bottom section, and the film was thin at the upper surface and the side surface at the middle section in the trench T.

On the other hand, in Example 1, the film thickness of the upper surface was 83.9%, the film thickness of the side surface at the upper section was 88.1%, the film thickness of the side surface at the middle section was 91.7%, the film thickness of the side surface at the lower section was 94.5%, and the deposition was performed such that the film thickness decreased from the lower section to the upper section of the trench T. Thus, according to Example 1 of the deposition method, the embedding deposition with good bottom-up property can 2C be performed as illustrated in FIG. 7.

Also, in Example 2, the film thickness of the upper surface was 70.5%, the film thickness of the side surface at the upper section was 83.1%, the film thickness of the side surface at the middle section was 81.0%, the film thickness of the side surface at the lower section was 81.7%, and the deposition was performed such that the film was thin at the upper surface of the trench T and was conformally in the trench T. Thus, according to Example 2 of the deposition method, a conformal embedding deposition could be performed in the trench T while suppressing the deposition on the upper surface of the trench T as illustrated in FIG. 7.

The results of Examples described above demonstrated that the embedding property at the time of embedding the film in the recessed pattern can be controlled.

It should be noted that the reaction area R4 is an example of a first plasma process area, and the first and second reforming areas R2 and R3 are an example of a second plasma process area. Also, the $NH_3$-containing gas is an example of a first process gas, the $N_2$-containing gas is an example of a second process gas, and the $H_2$-containing gas is an example of a third process gas in the above-described embodiment.

The embodiments disclosed herein should be considered to be exemplary in all respects and not restrictive. The above embodiments may be omitted, substituted, or modified in various forms without departing from the appended claims and spirit thereof.

In the embodiments described above, the deposition apparatus is a semi-batch type apparatus that revolves a plurality of wafers W arranged on the surface of the rotation table 12 in the vacuum container 11 by the rotation table 12, that causes the wafers W to pass through a plurality of areas in order, and that processes the wafers W, but the present disclosure is not limited to this. For example, a deposition apparatus may be a single-wafer type apparatus that processes wafers one by one. Also, for example, the deposition apparatus may be a batch type apparatus that processes a plurality of wafers at once. In a case in which the deposition apparatus is a single-wafer type or batch type apparatus, the embedding property can be controlled by changing the pressure in the vacuum container in the $N_2$ plasma process or the processing time in the $N_2$ plasma step, for example.

What is claimed is:

1. A deposition method for embedding a SiN film in a recess formed on a surface of a substrate, the deposition method comprising:
    (a) activating and supplying a first process gas containing $NH_3$ to the surface of the substrate to cause NHx groups to adsorb on the surface of the substrate, where x is 1 or 2;
    (b) supplying a silicon-containing gas to the surface of the substrate on which the NHx groups are adsorbed to cause the silicon-containing gas to adsorb on the NHx groups;
    (c) repeating (a) and (b) multiple times until a first SiN film is conformally deposited in the recess;
    (d) activating and supplying a second process gas containing $N_2$ to the surface of the substrate on which the NHx groups are adsorbed to replace the NHx groups at a top of the recess with N groups;
    (e) activating and supplying the first process gas to the surface of the substrate to cause the NHx groups to absorb on the surface of the substrate;
    (f) supplying the silicon-containing gas to the surface of the substrate on which the NHx groups absorb to cause the silicon-containing gas to absorb on the NHx groups; and
    (g) repeating (e) and (f) multiple times until a second SiN film is deposited at a bottom of the recess such that the second SiN film is thicker than the first SiN film,
    wherein (d) and (g) are repeated multiple times after performing (c).

2. The deposition method according to claim 1, wherein the first process gas is a gas that does not contain $N_2$.

3. The deposition method according to claim 1, wherein the first process gas and the second process gas are activated by plasma.

4. The deposition method according to claim 1, further comprising:
    activating and supplying a third process gas containing $H_2$ to the surface of the substrate on which the silicon-containing gas is adsorbed.

5. The deposition method according to claim 1,
    wherein the substrate is arranged along a circumferential direction on a surface of a rotation table provided in the process container,
    wherein, in a process container, a first plasma process area for performing (a), an adsorption area for performing (b), and a second plasma process area for performing (d) are provided along a rotation direction of the rotation table above the rotation table,
    wherein (a) and (b) are performed on the substrate by rotating the rotation table in a state in which the first process gas is supplied to the first plasma process area and the silicon-containing gas is supplied to the adsorption area, and
    wherein (d) is performed by rotating the rotating table in a state in which the second process gas is supplied to the second plasma process area.

6. The deposition method according to claim 5, wherein a rotation speed of the rotation table when (d) is performed is higher than a rotation speed of the rotation table when (a) and (h) are performed.

7. The deposition method according to claim 1, wherein a ratio of a time period during which (d) is performed to a time period during which (g) is performed is adjusted to control a depth at which the second SiN film is embedded in the recess.

* * * * *